(12) United States Patent
Kuenemund et al.

(10) Patent No.: US 7,830,170 B2
(45) Date of Patent: Nov. 9, 2010

(54) LOGIC GATE

(75) Inventors: Thomas Kuenemund, Munich (DE); Artur Wroblewski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/346,240

(22) Filed: Dec. 30, 2008

(65) Prior Publication Data

US 2010/0164549 A1 Jul. 1, 2010

(51) Int. Cl.
*H03K 19/096* (2006.01)
(52) U.S. Cl. .................................... 326/37; 326/114
(58) Field of Classification Search ............. 326/95–98, 326/113, 114
See application file for complete search history.

(56) References Cited

U.S. PATENT DOCUMENTS 6,914,452 B2 * 7/2005 Gauthier et al. ............... 326/98
6,940,314 B1 * 9/2005 Bloker et al. .................. 326/98
6,978,387 B2 * 12/2005 Bosshart ...................... 713/300
7,109,757 B2 * 9/2006 Yuan et al. ..................... 326/95

OTHER PUBLICATIONS

Sedra et al., Microelectronic Circuits, 1998, Oxford University Press, forth edition, pp. 1062-1063.*

* cited by examiner

*Primary Examiner*—James Cho
(74) *Attorney, Agent, or Firm*—Dickstein Shapiro LLP (57) ABSTRACT

A logic gate comprises a first switch, a second switch, a data network and a keeping circuitry. The first switch is adapted to connect a logic node to a first potential responsive to a transition of an enabling signal. The second switch is adapted to connect the logic node to a second potential via an electrical path responsive to a transition of the enabling signal. The data network is serially connected within the electrical path. The keeping circuitry comprises third and fourth switches serially connected between the logic node and the first potential and being controllable separately from each other, the third switch being adapted to be closed in case a potential on the logic node assumes the first potential and to be opened in case the potential on the logic node assumes the second potential.

8 Claims, 8 Drawing Sheets

LOGIC GATE

BACKGROUND

Exemplary embodiments relate to a logic gate. A logic gate may, for example, be used in dynamic logic circuits and drivers which are recently developed logic circuits designed for high-speed digital electronics, particularly computer CPUs. Logic circuits may comprise logic gates to form combinational logic paths for usage in FPGA, PLD or micro processor circuits of data processing systems. Logic gates may be applied in decoding circuits, for example, address decoding circuits or other circuits performing Boolean operations. Logic gates comprise transistors for realizing logic functions and may be implemented as a semiconductor circuit on a semiconductor wafer. The transistors may be realized in a CMOS semiconductor process.

Logic gates being applied in dynamic logic circuits comprise an enable signal for setting the logic gate in a precharged state and a successive evaluation state. The enable signal may be provided by a clock line. Logic gates may be implemented in Domino logic, which is a popular (CMOS-based) implementation of dynamic logic, developed to speed up circuits.

Dynamic logic circuits performing a two-phase calculation (precharge phase followed by evaluation phase) should be carefully designed with respect to transistor dimensions. Misadjustments may result in driver conflicts during a transition between the two phases which may cause short-circuit currents damaging the whole circuit. Dimensioning of transistors of dynamic logic circuits with respect to charge balance, chip area, power dissipation and robustness against disturbing influences becomes a risk for the functionality of the circuit, especially at low supply voltages and for high transistor threshold voltages (VTs). For dynamic logic circuits susceptibility to failure is stronger depending on the circuit design tha for static logic circuits.

SUMMARY

Exemplary embodiments provide a logic gate, comprising a first switch, a second switch, a data network and a keeping circuitry. The first switch is adapted to connect a logic node to a first potential responsive to a transition of an enabling signal from a first logic state to a second logic state. The second switch is adapted to connect the logic node to a second potential via an electrical path responsive to a transition of the enabling signal from the second logic state to the first logic state. The data network is serially connected within the electrical path and is adapted to disable and enable the electrical path responsive to data of a data input. The keeping circuitry comprises third and fourth switches serially connected between the logic node and the first potential and being controllable separately from each other, the third switch being adapted to be closed in case a potential on the logic node assumes the first potential and to be opened in case the potential on the logic node assumes the second potential.

BRIEF DESCRIPTION OF THE DRAWINGS

With reference to the accompanying FIGS. 1-3, embodiments of a logic gate will be described.

FIG. 1b shows a timing diagram of signals associated with the logic gate as depicted in FIG. 1a;

DETAILED DESCRIPTION

Figure 1A:
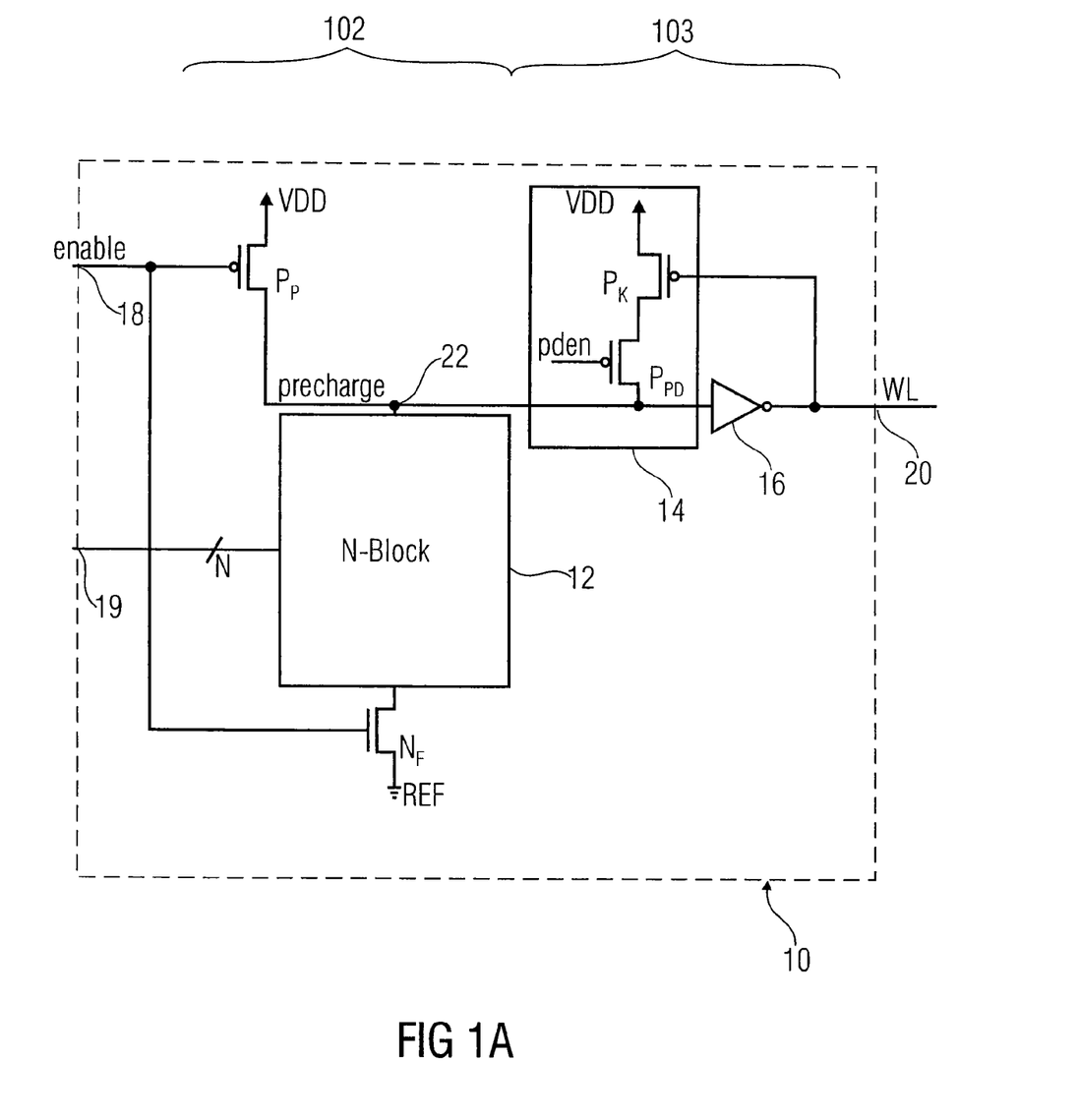
FIG. 1a shows a circuit diagram of a logic gate according to an exemplary embodiment.

In FIG. 1a a logic gate according to an exemplary embodiment is depicted.

The logic gate 10 comprises a pull-down network 12, also referred to as "N-block", a precharge transistor $P_P$, a base transistor $N_F$, also referred to as foot transistor, a keeping circuitry 14 comprising a keeping transistor $P_K$ and a switching transistor $P_{PD}$. The logic gate 10 further comprises an inverter 16.

The logic gate 10 comprises an enabling input 18 for receiving an enabling signal "enable", a logic tree input 19 for receiving N logic inputs of the N-Block 12 and an output 20 for providing a data output signal WL. The precharge transistor $P_P$ is connected between a supply node VDD and a logic node 22 and comprises a control terminal which is connected to the enabling input 18 to receive the enabling signal "enable". The precharge transistor $P_P$ is a p-channel (e.g. MOSFET) transistor. The base transistor $N_F$ is connected between a reference node REF and the N-Block 12 and comprises a control terminal which is connected to the enabling input 18 to receive the enabling signal "enable". The base transistor $N_F$ is an n-channel (e.g. MOSFET) transistor.

The pull-down network 12 is connected between the logic node 22 and the base transistor $N_F$. The pull-down network 12 comprises the logic tree input 19 for receiving the N logic inputs. The pull-down network 12 either pulls the logic node 22 to a logic zero or leaves it at its logic one pre-charged state in response to a Boolean combination of the N logic inputs.

The keeping circuitry 14 comprises a series connection of the keeping transistor $P_K$ and the switching transistor $P_{PD}$. The series connection of keeping transistor $P_K$ and switching transistor $P_{PD}$ is connected between the supply node VDD and the logic node 22. Both transistors $P_K$ and $P_{PD}$ are p-channel (e.g. MOSFET) transistors. A control terminal of the keeping transistor $P_K$ is coupled via the inverter 16 to the logic node 22. The control terminal of the keeping transistor $P_K$ is connected to the output 20 of the logic gate 10. A control terminal of the switching transistor $P_{PD}$ is controlled by a switching control signal "pden".

The central element of the exemplary embodiment is represented by the switching transistor $P_{PD}$ which is controlled by the switching control signal "pden" "pden". It is its task to speed up the circuit, to avoid short-circuit currents and to reduce the faulty dimensioning risk as well as susceptibility to failure.

To clarify the functionality of the switching transistor $P_{PD}$, in a first section the logic gate 10 is described without the functionality of the switching transistor $P_{PD}$. This can be achieved by an always switched-on switching transistor $P_{PD}$, for example, by setting the switching control signal "pden"

"pden" to a logical 0. In a successive section the functionality of the switching transistor $P_{PD}$ is described by choosing an adequate control of the switching control signal "pden".

In the initial state for the consideration, the enabling signal "enable" is in the state 0 and the output ("WL" node) 20 takes on the logical value 0. The logical states of the inputs 19 in the pull-down network 12 remains without influence on the output 20. By the effect of the precharge transistor $P_P$ and the keeping transistor $P_K$, the logic node 22, also referred to as "precharge" node is in the logical precharge state 1, the switching transistor $P_{PD}$ is always switched-on.

Thereupon, valid data are applied to the pull-down network 12, with the enabling signal "enable" and the output ("WL" node) 20 still being in the state 0. Furthermore, the enabling signal "enable" changes to the state 1. Thus, the precharge transistor $P_P$ is blocked, and the base transistor $N_F$ enables the pull-down network 12. The "precharge" node 22 takes on the state 1 or 0, corresponding to the occupancy of the inputs 19 in the pull-down network 12. In the first case, the circuit 10 does not change its state. If the occupancy of the inputs 19 of the pull-down network 12 is, however, such that the pull-down network 12 connects through, the following situation arises.

In the series connection comprising the base transistor $N_F$ and the N transistors of the pull-down network 12, a current flow develops and the charge that was stored on the "precharge" node 22 as well as maybe on the intermediate nodes of the pull-down network 12 flows off to ground REF. At (nearly) the same time, however, the output 20 still is in the state 0, and the keeping transistor $P_K$ thus is conducting. It supplies the "precharge" node 22 with charge. Thus, the keeping transistor $P_K$ drives ("fights") against the pull-down network 12. In the path from the supply node VDD via the keeping transistor $P_K$, the pull-down network 12 and the base transistor $N_F$, a short-circuit current flows. This happens until the "precharge" node 22 has reached the state 0 and then the output ("WL" node) 20 the state 1. Only then the keeping transistor $P_K$ is turned off.

The prerequisite for the correct functionality of the circuit 10 consists in the fact that the keeping transistor $P_K$ provides less charge than the amount of charge led off to ground by the pull-down network 12 in series with the base transistor $N_F$. This can be the case if the keeping transistor $P_K$ is dimensioned to be sufficiently weak as compared with the transistors of the pull-down network 12. Thus, there is the possibility of faulty dimensioning of the keeping transistor $P_K$, so that the pull-down network 12, particularly if it is a series connection of several N (e.g. n-channel) transistors, does not have enough driver strength to overcome the current of the keeping transistor $P_K$. If the pull-down network 12 is not constructed of transistors having great width, the keeping transistor $P_K$ should be adapted by enlarging the transistor length. Here, it should be taken into consideration that such a dimensioning possibly may be produced only with great tolerance for technological reasons. Apart from area losses, this leads to the design risk and reduced robustness.

Furthermore, at low supply voltage, the driver capability of the series connection of N transistors decreases more quickly than that of the individual keeping transistor $P_K$. In an otherwise robust circuit, this may lead to malfunction.

It is also disadvantageous that the pull-down network 12, which determines the logic function of the logic gate 10, is hindered in its driver capability by the keeping transistor $P_K$, since the current through the p-channel keeping transistor $P_K$ drives against the current of the pull-down network 12, whereby the switching speed of the circuit 10 is affected noticeably. This effect also is more strongly pronounced toward lower supply voltages.

If it is attempted to avoid the above mentioned effect, there is the risk of the keeping transistor $P_K$ being designed to be too weak. In turn, this might entail that the "precharge" node 22 is not protected sufficiently against external disturbances.

An introduction of the switching transistor $P_{PD}$ and its control by the switching control signal "pden" overcomes the problems mentioned above. The functionality of the logic gate 10 comprising the switching transistor $P_{PD}$ is described hereinafter. The "precharge" node 22 is stabilized and secured against coupling and leakage losses, not by a keeping transistor $P_K$, but by a series connection of the keeping transistor $P_K$ and the switching transistor $P_{PD}$, or the keeping circuitry 14, respectively. The sequence of the keeping transistor $P_K$ and the switching transistor $P_{PD}$ in the series-connection is irrelevant here. Also the sequence of the base transistor $N_F$ and the N-Block 12 is irrelevant.

The gate terminal of the keeping transistor $P_K$ is attached to the output node 20 for providing the output signal WL. The switching transistor $P_{PD}$ is connected in series with the keeping transistor $P_K$ into the path between the supply node VDD and the "precharge" node 22 and is controlled by the switching control signal "pden".

The initial state for the consideration corresponds to the one already described above. In the precharge state, the enabling signal enables in the state 0, and the output ("WL" node) 20 takes on the value 0. The switching control signal "pden" here also is logically 0. Now, the "precharge" node 22 is in the precharge state through the effect of the precharge transistor $P_P$, and the series connection of the keeping transistor $P_K$ and the switching transistor $P_{PD}$. The occupancy of the inputs 19 in the pull-down network 12 remains without effect.

Valid data are further applied to the pull-down network 12, with the enabling signal "enable" as well as the output 20 and the switching control signal "pden" still being in the state 0.

Thereupon, the enabling signal "enable" and the switching control signal "pden" (nearly) simultaneously change into the state 1. Alternatively, the switching control signal "pden" may be set into the state 1 earlier. Thus, the precharge transistor $P_P$ and the switching transistor $P_{PD}$ are blocked, and the base transistor $N_F$ enables the pull-down network 12. The path between the supply node VDD and the "precharge" node 22 is interrupted by the switching transistor $P_{PD}$. The "precharge" node 22 takes on the state 1 or 0, corresponding to the occupancy of the inputs 19 in the pull-down network 12. In the first case, the circuit 10 does not change its state.

However, if the occupancy of the inputs 19 of the pull-down network 12 is such that the pull-down network 12 connects through, the following situation arises.

In the series connection comprising the base transistor $N_F$ and the N transistors of the pull-down network 12, a current flow develops, and the charge that was stored on the "precharge" node 22, as well as maybe on the intermediate nodes of the pull-down network 12 flows off to ground REF. Since the switching transistor $P_{PD}$ now blocks, the pull-down network 12 only has to drain off the charge stored on the above-mentioned nodes. No additional charge is supplied by the keeping transistor $P_K$, and short-circuit current does not flow either.

After the "precharge" node 22 has reached a state corresponding to the input 19 occupancy and function of the pull-down network 12, the switching control signal "pden" may again change to the state 0. In case the pull-down network 12 does not switch, i.e. the "precharge" signal (at the "precharge" node 22) remains logically 1, this change should happen quickly so as not to leave the "precharge" node 22 in a non-driven state for long.

Switching on the switching control signal "pden" may be linked directly to the enabling signal "enable". Switching off may be realized by a delay chain, for example. This is possible in short combinational paths with many gates switching in parallel.

If the switching control signal "pden" is controlled correctly, embodiments of the exemplary embodiment offer a series of advantages. There is no risk of the keeping transistor $P_K$ being dimensioned to be too strong (or the pull-down network 12 to be dimensioned too weak). The transistor length of the keeping transistor $P_K$ remains minimal. The speed the pull-down network 12 can work with is increased because less charge has to be drained-off. The functionality of the circuit 10 is not at risk even at low supply voltages. There is no risk of the keeping transistor $P_K$ being dimensioned to be too weak. With this, the susceptibility of the "precharge" node 22 to disturbing influences is reduced. The short-circuit current is avoided, the power consumption drops. Potentially, a reduction in area is achieved, because the width of the transistors in the pull-down network 12 may be dimensioned to be smaller. Additionally, the length of the keeping transistor $P_K$ may be kept minimal.

By the inclusion and the control of the switching transistor $P_{PD}$ a speed-up of the circuit 10, avoidance of short circuit currents and reduction of the faulty dimensioning risk as well as susceptibility to failures is achieved.

Exemplary embodiments may be applied as speed-up and robustness measure also in dynamic logic, for example, Domino circuits. In these families of circuits, the keeping transistor $P_K$ often is required only when circuit 10 is in idle state, because otherwise the time in which the "precharge" node 22 is not driven is very short. Here, the control of the switching transistor $P_{PD}$ by the switching control signal "pden" is also very simple. The switching transistor $P_{PD}$ is blocked in the active phase and switched on in the inactive phase.

If the keeping transistor $P_K$ is to become effective also in the active phase, the switch-off time instant for the switching control signal "pden" can be derived from the enabling signal "enable", for example, through delay.

Figure 1B:
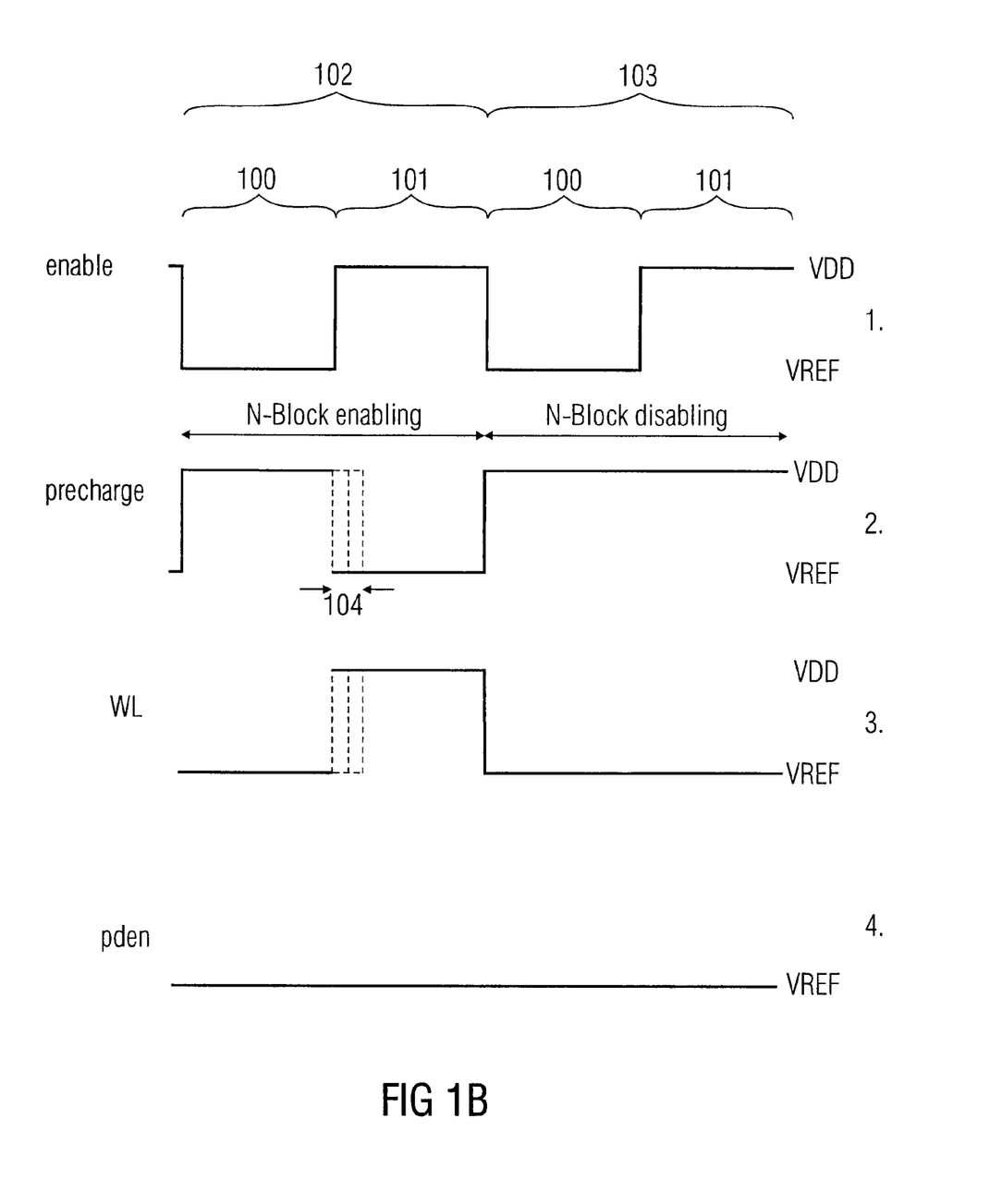

FIG. 1b shows a set of timing diagrams of signals associated with the logic gate 10 as depicted in FIG. 1a. In a first timing diagram (1.) the timing of the enabling signal "enable" is depicted. The enabling signal assumes a first signal state VREF and a second signal state VDD and is a periodical signal. The first signal state VREF corresponds to a precharge phase 100 while the second signal state VDD corresponds to an evaluation phase 101 of the logic gate 10.

A second timing diagram (2.) depicts the timing of the precharge signal "precharge" which is the signal state which the logic node 22 assumes when the logic gate 10 is enabled by the enabling signal "enable". In a first period 102 of the enabling signal, the pull down-network (N-block) 12 is enabling the discharge of logic node 22 while in a second period 103 of the enabling signal the N-block 12 is disabling the discharge of logic node 22. During the precharge phase 100 of the first period 102, the precharge signal is inverse to the enabling signal. When the enabling signal changes from the first state VREF to the second state VDD and the N block 12 is enabling, a driver conflict may occur such that a switching of the precharge signal from VDD to VREF does not occur upon the rising edge of the enabling signal. For a short conflicting time period 104, a switching of the precharge signal may be non-deterministic as the charge of the logic node 22 is fed to VREF by the N-block 12 while at the same conflicting time period 104, the keeping transistor $P_K$ is delivering a charge of potential VDD to the logic node 22. During the second period 103 of the enabling signal, the N-block 12 is disabling the discharge of the logic node 22 such that the precharge signal assumes the second state VDD without a change upon a rising edge of the enabling signal.

The third timing diagram (3.) shows the timing behavior of the output signal "WL" of the logic gate 10 which shows the inverse signal state as the precharge signal.

A fourth timing diagram (4.) shows the timing of the switching control signal "pden" which holds the first state VREF for the complete representation time depicted in FIG. 1b. This corresponds to a permanent through connection of the switching transistor PPD.

Figure 1C:
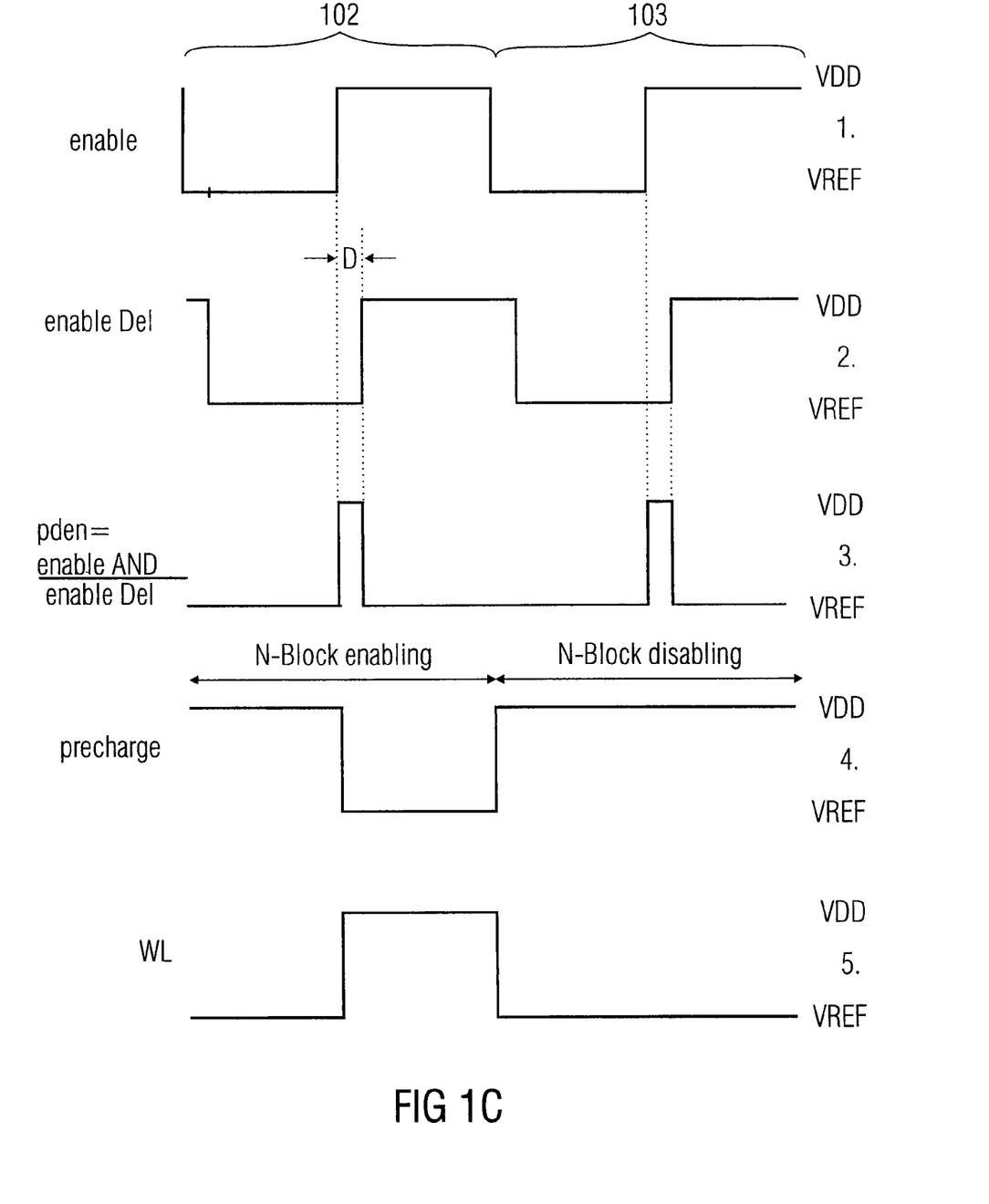
FIG. 1c shows another timing diagram of signals associated with the logic gate as depicted in FIG. 1a according to an exemplary embodiment.

FIG. 1c shows another set of timing diagrams of signals associated with the logic gate 10 as depicted in FIG. 1a according to an exemplary embodiment. A first timing diagram (1.) shows the timing of the enabling signal "enable" which corresponds to the timing of the enabling signal as depicted in FIG. 1b.

The second timing diagram (2.) shows a timing of a delayed enabling signal "enableDel". A delay of D is applied to the enabling signal "enable" to obtain the delayed enabling signal "enableDel".

A third timing diagram (3.) shows the timing of the switching control signal "pden" which corresponds to the enabling signal "enable" combined with the inverse of the delayed enabling signal "enableDel" by a logical AND combination.

A fourth timing diagram (4.) depicts the timing of the precharge signal during a first period 102 of the enabling signal when the N-block is enabling the discharge of logic node 22 and during a second period 103 of the enabling signal when the N-block is disabling the discharge of logic node 22. In contrast to the precharge signal depicted in FIG. 1b, the precharge signal depicted in FIG. 1c is changing its signal state during the first enabling signal period 102 (N-block is enabling) from VDD to VREF in a deterministic manner upon a rising edge of the enabling signal without a conflicting time period 104. No driver conflicts can be seen in the timing diagram (4.) of the precharge signal. This results from the control of the switching control signal "pden" which switches off the first potential VDD from the logic node 22 during a transition of the enabling signal from VREF to VDD for the duration of the delay time D. After the delay time D when the discharging process is finished and the precharge signal assumes a logical 0, the switching control signal "pden" switches-on the switching transistor $P_{PD}$ to allow the keeping transistor $P_K$ taking over control.

The delay time D may be dimensioned such that a bridging of the conflicting time period 104 as depicted in FIG. 1b may be achieved. The delay time D may, for example, be greater or equal to the conflicting time period 104.

A fifth timing diagram (5.) depicts the timing of the output signal "WL" which assumes the inverse value of the precharge signal without showing any driver conflicting phases as the output signal "WL" depicted in FIG. 1b.

Figure 2:
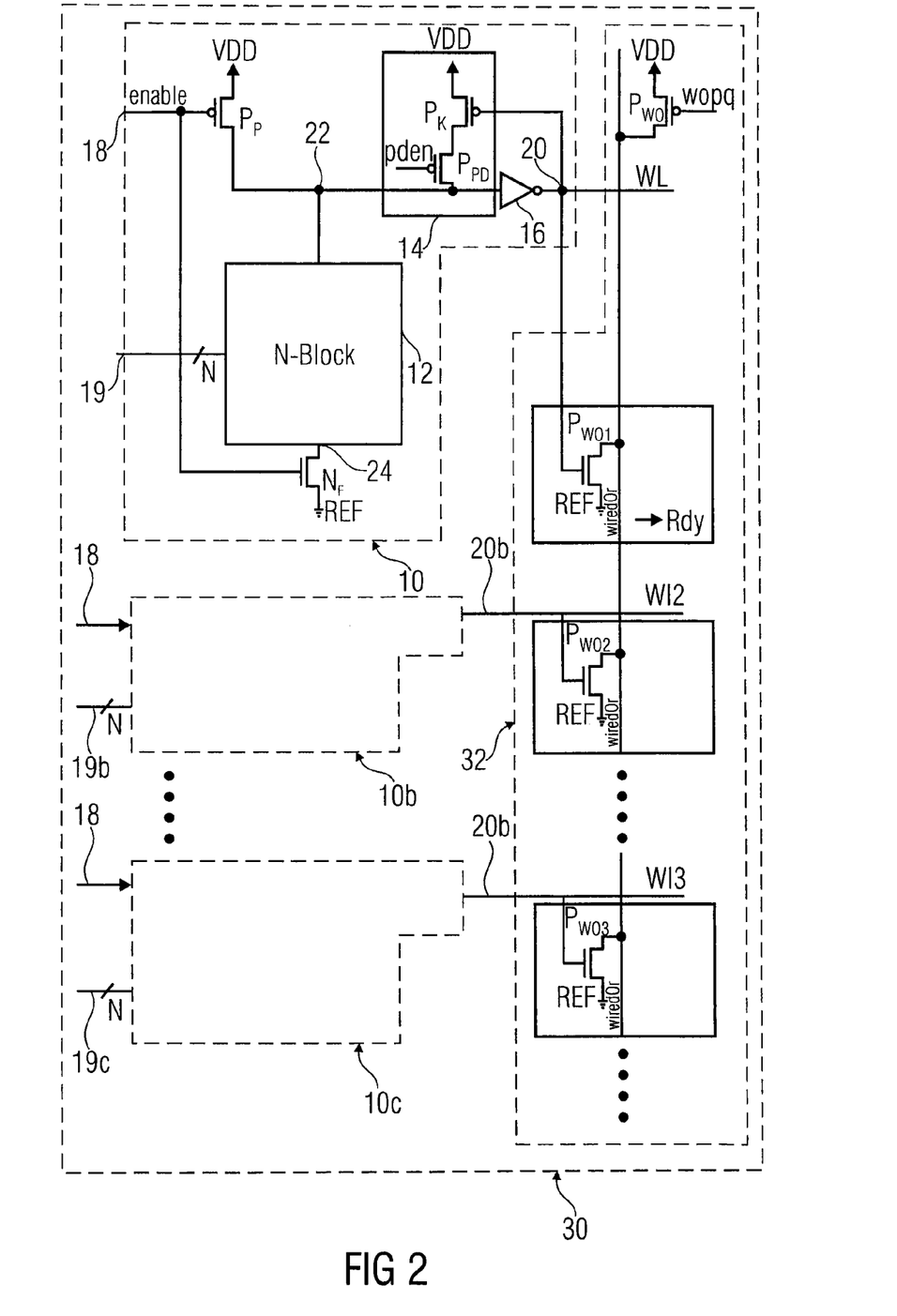
FIG. 2 shows a circuit diagram of an address decoding circuit according to an exemplary embodiment.

FIG. 2 shows an address decoding circuit 30 according to an exemplary embodiment. The address decoding circuit 30 uses a Wired-OR circuitry 32 for generation of a switching control signal "pden" (Rdy, respectively). The address decoding circuit 30 comprises a logic gate 10 which corresponds to the logic gate 10 as described in FIG. 1 having an enabling input 18 for receiving an enabling signal "enable", a logic tree input 19 for receiving N logic inputs of the N-block 12 and an output 20 for providing a data output signal WL. The address decoding circuit 30 further comprises a plurality of further logic gates 10b, 10c and the Wired-OR circuitry 32. Each of the further logic gates 10b, 10c corresponds to the logic gate 10 as described in FIG. 1. While having a same enabling input 18 for receiving an enabling signal "enable" each of the further logic gates comprises an individual logic tree input 19b, 19c for receiving N logic inputs and an individual output 20b, 20c for providing a plurality of further data output signals WL2, WL3.

The Wired-OR circuitry 32 comprises a Wired-OR node "wiredOR", a supply transistor $P_{WO}$, an output transistor $P_{WO1}$ associated with the logic gate 10 and a plurality of further output transistors $P_{WO2}$, $P_{WO3}$ associated with a respective further logic gate 10b, 10c. A control terminal of the output transistor $P_{WO1}$ is connected to the output 20 of the logic gate 10. Control terminals of the further output transistors $P_{WO2}$, $P_{WO3}$ are connected to the outputs 20b, 20c of the respective further logic gates 10b, 10c. A first channel terminal of the output transistor $P_{WO1}$ is connected to the reference node REF and a second channel terminal of the output transistor $P_{WO1}$ is connected to the Wired-OR node "wiredOr". First channel terminals of the further output transistors $P_{WO2}$, $P_{WO3}$ are connected to the reference node REF and second channel terminals of the further output transistors $P_{WO2}$, $P_{WO3}$ are connected to the Wired-OR node.

The supply transistor $P_{WO}$ is controlled by a supply control signal "wopq" at its control terminal. The supply transistor $P_{WO}$ is connected between the supply node VDD and the Wired-OR node "wiredOR".

While the supply transistor $P_{WO}$ may be shared between different logic gates 10, 10b, 10c a respective output transistor $P_{WO1}$, $P_{WO2}$, $P_{WO3}$ will be used for each logic gate 10, 10b, 10c.

A condition for the switching-on (closing) of the switching transistor $P_{PD}$ by the switching control signal "pden" may be derived from the signal at the Wired-OR node "wiredOr" which is denoted by "Rdy" in FIG. 2. The logic gate 10 may be applied in any type of address decoding circuit 30 because the point at time in which the switching control signal "pden" is reset to the state 0 can be determined in a particularly simple way here. Since an address decoder 30 typically works in a "one-hot" arrangement, only one of the address decoder cells 10, 10b, 10c changes its state. The outputs 20, 20b, 20c of the cells 10, 10b, 10c may be linked by means of a "Wired-OR" connection. A "Wired-OR" connection connects different outputs 20, 20b, 20c in a direct way without wasting resources to save power. If the common node "wiredOr" has changed its state, the switching control signal "pden" can safely be placed into the state 0 again. The state of the node "wiredOr" is evaluated and has direct influence on the switching control signal "pden". Here, the supply transistor $P_{WO}$ is implemented only once for the entire address decoder 30.

Figure 3A:
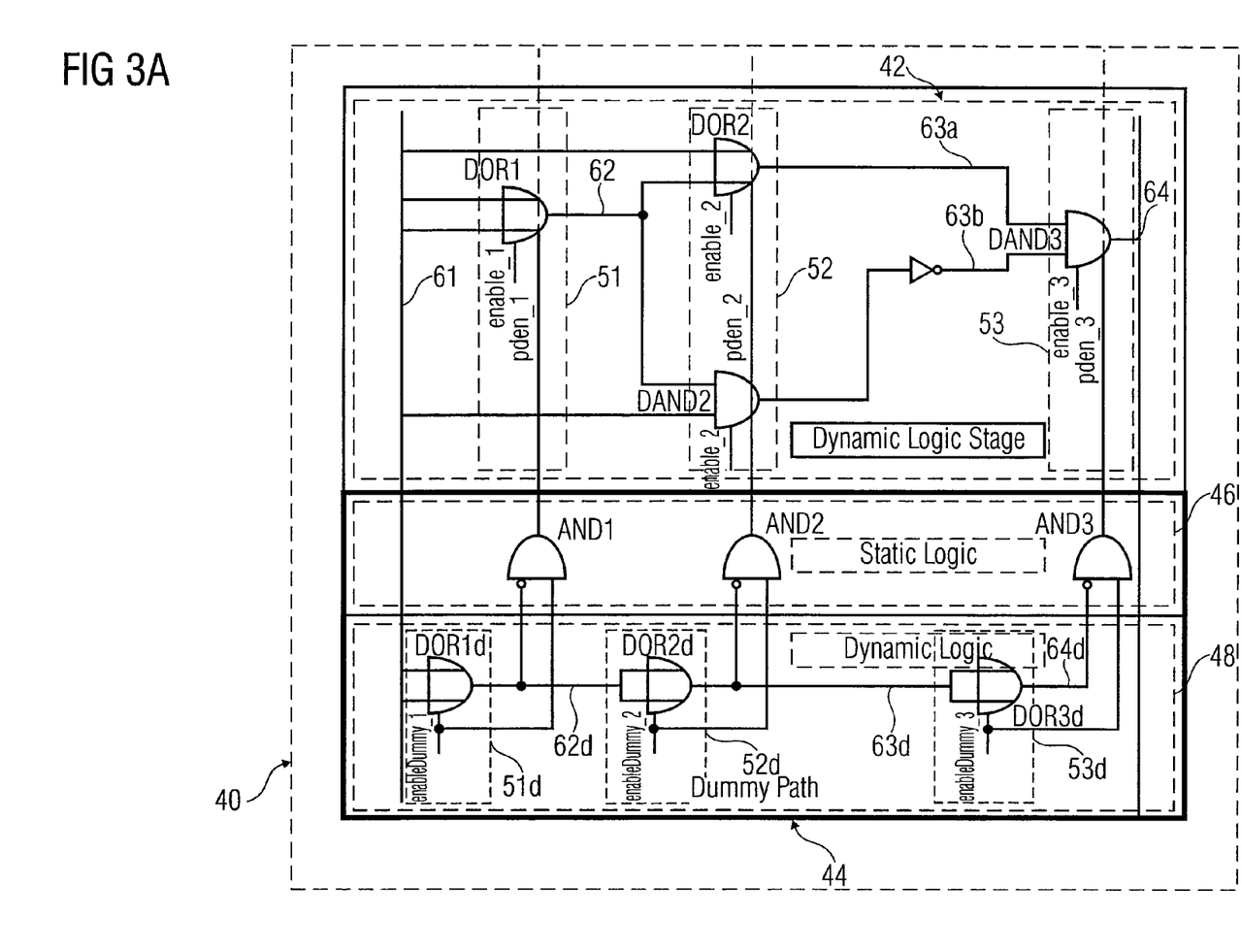
FIG. 3a shows a circuit diagram of a logic circuit comprising logic gates and a reference path for generating a switching control signal for the logic gates according to an exemplary embodiment.

FIG. 3a shows a logic circuit 40 comprising logic gates and a reference path for generating a switching control signal for the logic gates according to an exemplary embodiment. The logic circuit 40 comprises a dynamic logic stage 42 and a dummy (reference) path stage 44 which are connected in parallel. The dummy path stage 44 comprises a static logic sub-circuit 46 and a dynamic logic sub-circuit 48.

The dynamic logic stage 42 comprises two dynamic logic OR gates DOR1 and DOR2 and two dynamic logic AND gates DAND2 and DAND3. The two dynamic logic OR gates and the two dynamic logic AND gates may represent logic gates 10, according to the logic gate 10 as depicted in FIG. 1a. The two dynamic logic OR/AND gates are arranged in propagation groups 51, 52, 53 with respect to signal propagation times which input signals of respective dynamic logic OR/AND gates experience when propagating through the dynamic logic stage 42. The first dynamic logic OR gate DOR1 is associated with the first propagation group 51. The second dynamic logic OR gate DOR2 and the first dynamic logic AND gate DAND2 are associated with the second propagation group 52. The second dynamic logic AND gate DAND3 is associated with the third propagation group 53.

A first propagation signal 61 which may correspond to one of the N logic inputs at the logic tree input 19 as depicted in FIG. 1 is provided at both inputs of the first dynamic logic OR gate DOR1, at the first input of the second dynamic logic OR gate DOR2 and at the second input of the first dynamic logic AND gate DAND2. A second propagation signal 62 is provided at the output of the first dynamic logic OR gate DOR1 which is connected to the second input of the second dynamic logic OR gate DOR2 and to the first input of the first dynamic logic AND gate DAND2. A third propagation signal 63a is provided at the output of the second dynamic logic OR gate DOR2 which is connected to the first input of the second dynamic logic AND gate DAND3. A fourth propagation signal 63b is provided at the output of the first dynamic logic AND gate DAND2 which is connected via an inverter INV to the second input of the second dynamic logic AND gate DAND3. A fifth propagation signal 64 is provided at the output of the second dynamic logic AND gate DAND3.

According to propagation times of their input signals the dynamic logic OR/AND gates are associated to propagation groups. As the first dynamic logic OR gate DOR1 has only the first propagation signal 61 as input it is associated with the first propagation group 51. The second dynamic logic OR gate DOR2 and the first dynamic logic AND gate DAND2 have beside the first propagation signal 61 additionally the second propagation signal 62 as input. The second propagation signal 62 has the additional signal propagation time of the first dynamic logic OR gate DOR1 with respect to the first propagation signal 61. Therefore, the second dynamic logic OR gate DOR2 and the first dynamic logic AND gate DAND2 are associated with the second propagation group 52. The second dynamic logic AND gate DAND3 has the propagation signals 63a, 63b as inputs which are related to signal propagation times of the first propagation signal 61 propagating through the first dynamic logic OR gate DOR1 and the second dynamic logic OR gate DOR2 or the first dynamic logic AND gate DAND2, respectively. The second dynamic logic AND gate DAND3 is associated with the third propagation group 53.

DOR1 is enabled by the enabling signal "enable_1", its switching transistor is controlled by the switching control signal "pden_1". DOR2 and DAND2 are enabled by the enabling signal "enable_2", their switching transistors are controlled by the switching control signal "pden_2". DAND3 is enabled by the enabling signal "enable_3", its switching transistor is controlled by the switching control signal "pden_3".

The dynamic logic sub-circuit 48 comprises three dummy dynamic logic OR gates DOR1d, DOR2d, DOR3d which are arranged in dummy propagation groups 51d, 52d and 53d associated with the propagation groups 51, 52 and 53 of the dynamic logic stage 42. Each of the dummy dynamic logic OR gates arranged in a respective dummy propagation group has a similar or identical signal propagation delay as the dynamic logic OR/AND gate of the propagation group the respective dummy propagation group is associated with.

A first dummy dynamic logic OR gate DOR1d is arranged in the first dummy propagation group 51d and receives the first propagation signal 61 at its first and second input. A second dummy dynamic logic OR gate DOR2d is arranged in the second dummy propagation group 52d and is connected with its both inputs to the output of the first dummy dynamic logic OR gate DOR1*d*. A third dummy dynamic logic OR gate DOR3*d* is arranged in the third dummy propagation group 53*d* and is connected with its both inputs to the output of the second dummy dynamic logic OR gate DOR2*d*.

The output signal 62*d* of DOR1*d* has a similar propagation delay as the second propagation signal 62. The output signal 63*d* of DOR2*d* has a similar propagation delay as the third or fourth propagation signals 63*a*, 63*b*. The output signal 64*d* of DOR3*d* has a similar propagation delay as the fifth propagation signal 64.

DOR1*d* is enabled by a first dummy enabling signal "enableDummy_1". DOR2*d* is enabled by a second dummy enabling signal "enableDummy_2". DOR3*d* is enabled by a third dummy enabling signal "enableDummy_3".

The static logic sub-circuit 46 is used to combine the output signals and associated enabling signals of the dummy dynamic logic OR gates DOR1*d*, DOR2*d* and DOR3*d* to provide switching control signals "pden1", "pden2", and "pden3" to the dynamic logic OR gates DOR1, DOR2 and dynamic logic AND gates DAND2 and DAND3.

The static logic sub-circuit 46 comprises three static logic AND gates. A first static logic AND gate AND1 combines the inverted output signal 62*d* of DOR1*d* and the first dummy enabling signal "enableDummy_1" by a logical AND combination to provide the first switching control signal "pden_1". A second static logic AND gate AND2 combines the inverted output signal 63*d* of DOR2*d* and the second dummy enabling signal "enableDummy_2" by a logical AND combination to provide the second switching control signal "pden_2". A third static logic AND gate AND3 combines the inverted output signal 64*d* of DOR3*d* and the third dummy enabling signal "enableDummy_3" by a logical AND combination to provide the third switching control signal "pden_3".

The switching control signals "pden_1", "pden_2" and "pden_3" are provided by a logic circuitry (dummy path stage 44) representing a reference circuit for the dynamic logic stage 42. By this circuitry it can be assured that the respective switching control signals have an adequate timing with respect to signal propagation delay of the dynamic logic gates DOR1, DOR2, DAND2 and DAND3.

For a greater number of combinational paths, the reference path 44 or dummy path, respectively setting the point in time at which the switching control signal "pden" is to be switched off in individual propagation groups 51, 52, 53 may be constructed. So, as to achieve better temporal behaviour the reference path 44 could operate in a slightly phase-shifted manner.

The dynamic logic OR gates DOR1, DOR2 and the dynamic logic AND gates DAND2, DAND3 of the dynamic logic stage 42 are examples illustrating the functionality of a logic gate 10 as depicted in FIG. 1*a*. Instead of a dynamic logic OR/AND gate also any other type of logic combinational element can be used. The dynamic logic OR gates DOR1*d*, DOR2*d*, DOR3*d* of the dynamic logic sub-circuit 48 are dimensioned to comprise similar signal propagation times as the dynamic logic gates of the dynamic logic stage 42. The output signals 62*d*, 63*d*, 64*d* of the dummy dynamic logic OR gates DOR1*d*, DOR2*d*, DOR3*d* are configured to change their signal state responsive to a transition of the respective dummy enabling signal from a logical 0 to a logical 1. The respective dummy enabling signals may be coupled to the respective enabling signals such that a signal transition of the respective enabling signal triggers a signal transition of the respective dummy enabling signal.

Figure 3B:
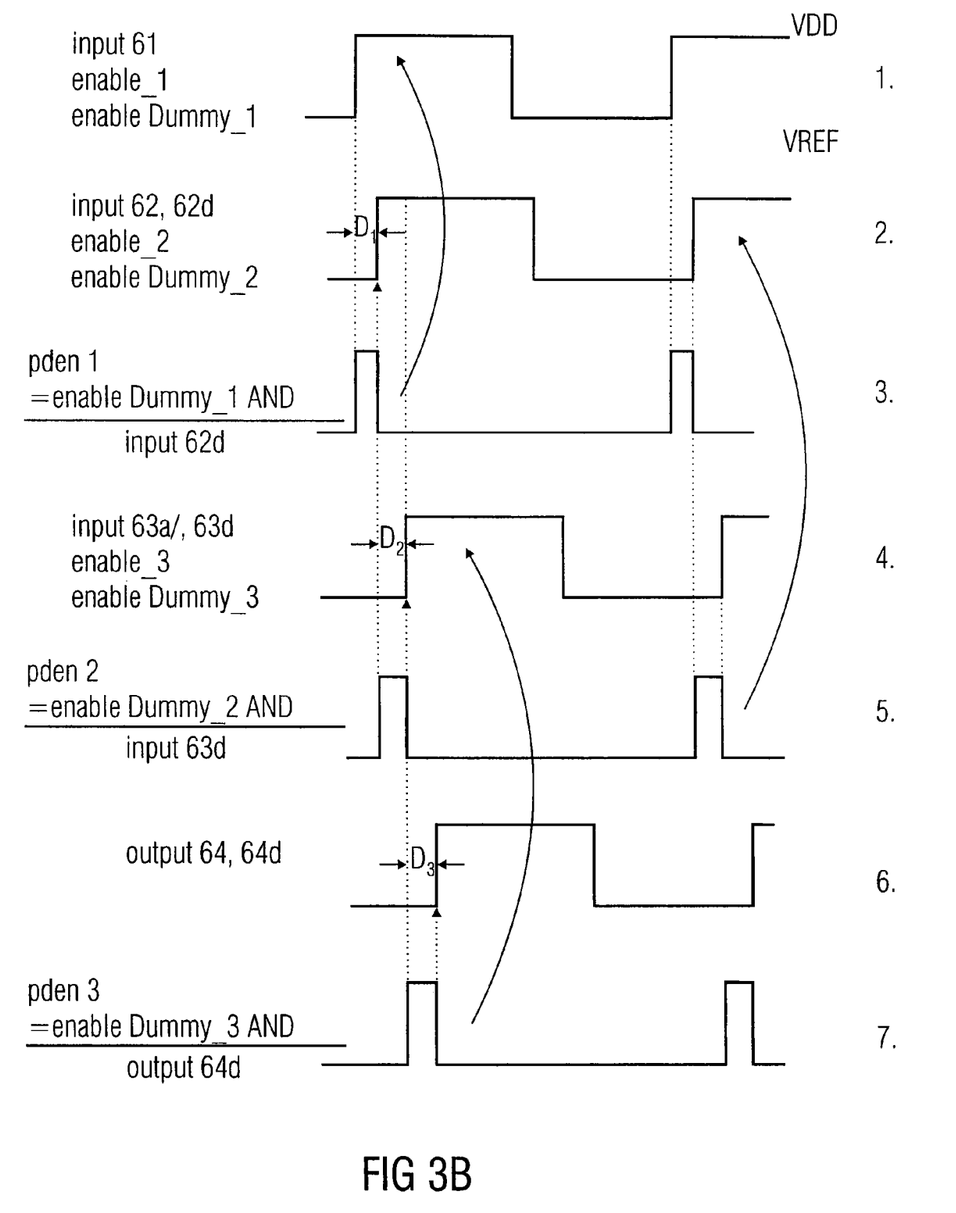
FIG. 3b shows a timing diagram of signals associated with the logic circuit as depicted in FIG. 3a according to an exemplary embodiment.

FIG. 3*b* shows a set of timing diagrams of signals associated with the logic circuit 40 as depicted in FIG. 3*a* according to an exemplary embodiment. The timing diagrams depicted in FIG. 3*b* are one possible implementation for dimensioning the logic circuit 40 as depicted in FIG. 3*a*. In this embodiment, the input signal 61, the first enabling signal "enable_1" and the first dummy enabling signal "enableDummy_1" are synchronized with respect to their rising and falling signal edges. In this embodiment all three signals are (nearly) equal.

A second timing diagram (2.) depicts the timing of the input signals 62, 62*d*, the second enabling signal "enable_2" and the second dummy enabling signal "enableDummy_2". These four signals have a synchronized timing and are delayed by a time delay $D_1$ with respect to the input signal 61, the first enabling signal and the first dummy enabling signal. The time delay $D_1$ results from the propagation delay of the dynamic OR gate DOR1 or from the propagation delay of the dynamic OR gate DOR1*d*, which is designed to have a similar propagation delay as the dynamic OR gate DOR1.

The third timing diagram (3.) depicts the timing of the first switching control signal "pden1" which is derived from the first dummy enabling signal "enableDummy_1" and the inverse of the input signal 62*d* by a logical AND combination. The first switching control signal "pden1" is synchronized to the input signal 61 and the first enabling signal "enable_1" such that a transition of the first enabling signal from a logical 0 "VREF" to a logical 1 "VDD" controls the switching transistor $P_{PD}$ of the first dynamic OR gate DOR1 to provide for an accelerated charge transition of the respective logic node 22.

The fourth timing diagram (4.) depicts the timing of the input signals 63*a*, 63*b*, 63*d*, the third enabling signal "enable_3" and the third dummy enabling signal "enableDummy_3". These signals are synchronized with respect to their rising and falling edges and are delayed by a second time delay $D_2$ with respect to the input signal 62 and the second enabling signal "enable_2". The second time delay $D_2$ corresponds to the propagation delay of the second dummy dynamic OR gate DOR2*d* which is dimensioned such that it has a similar propagation delay corresponding to the second dynamic OR gate DOR2 or the first dynamic AND gate DAND2, respectively.

The fifth timing diagram (5.) depicts the timing of the second switching control signal "pden2" which corresponds to a logical AND combination of the second dummy enabling signal "enableDummy_2" and the inverse of the input signal 63*d* of the third dummy dynamic OR gate DOR3*d*. The second switching control signal "pden2" is synchronized to the second enabling signal "enable_2" and is dimensioned such that the switching transistor $P_{PD}$ of the second dynamic OR gate DOR2 and the first dynamic AND gate DAND2 are controlled to provide for an accelerated charge transition of their respective logic nodes 22.

A sixth timing diagram (6.) shows a timing of the output signals 64, 64*d* of the third dummy dynamic OR gate DOR3*d* and the second dynamic AND gate DAND3, respectively. Both signals are synchronized with respect to their rising and falling signal edges and are delayed by a time delay $D_3$ with respect to the third enabling signal "enable_3" and the input signals 63*a*, 63*b*, 63*d* of DAND3 and DOR3*d*, respectively. The third time delay $D_3$ corresponds to a propagation delay of the third dummy dynamic OR gate DOR3*d* which is dimensioned to be similar to the signal propagation delay of the second dynamic AND gate DAND3.

The seventh timing diagram (7.) shows the timing of the third switching control signal "pden3" which corresponds to a logical AND combination of the third dummy enabling signal "enableDummy_3" and the inverse of the output signal "output 64d" of the third dummy dynamic logic OR gate DOR3d. The third switching control signal "pden3" is synchronized to the third enabling signal "enable_3" and the input signals 63a, 63b, 63d of DAND3 and DOR3d, respectively, to provide for an accelerated charge transition of their respective logic nodes 22.

Figure 4A:
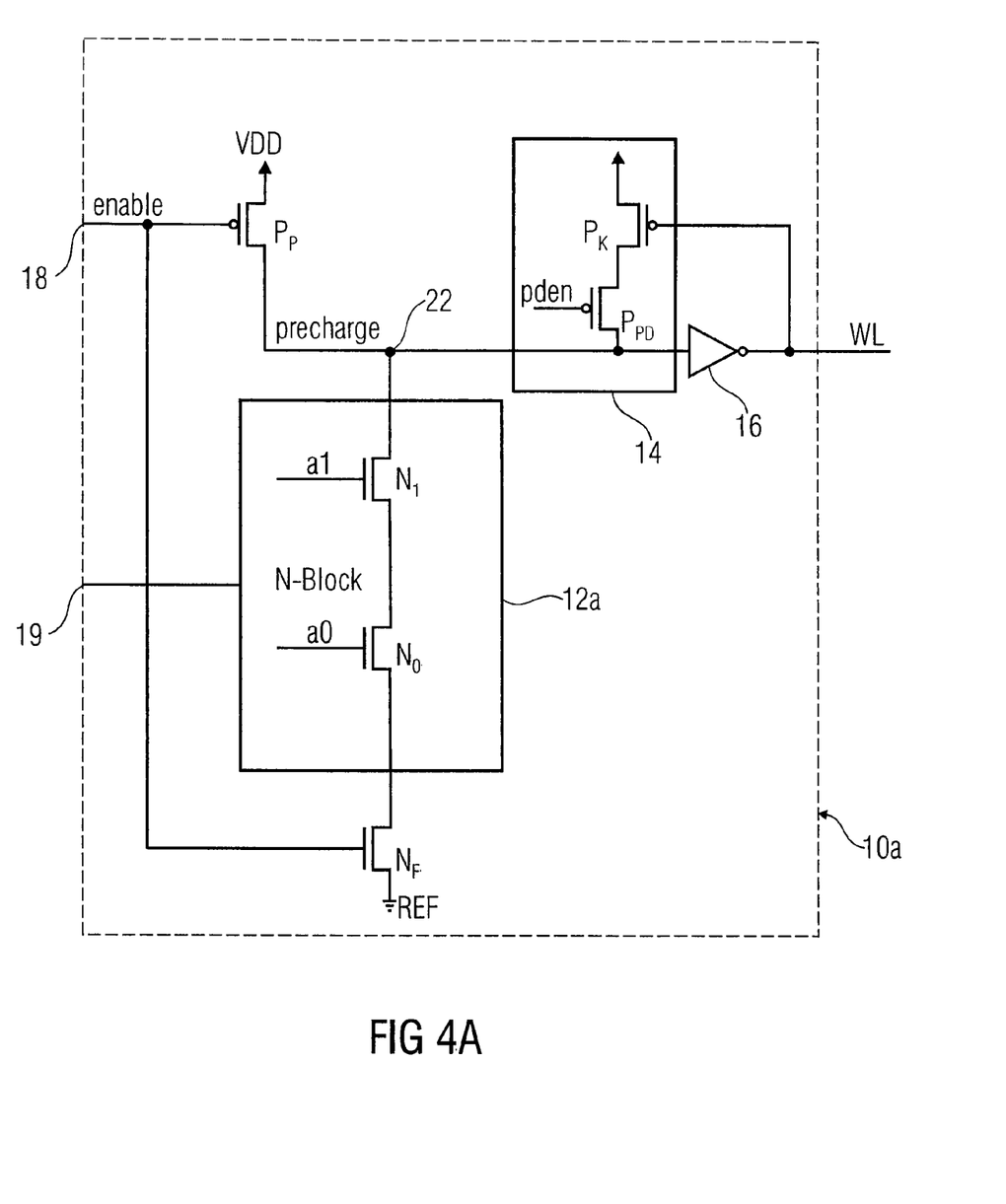
FIG. 4a shows a circuit diagram of the logic gate as depicted in FIG. 1a, the N-Block comprising a dynamic logic AND gate according to an exemplary embodiment.

FIG. 4a shows a circuit diagram of the logic gate 10 as depicted in FIG. 1a, wherein the N-block 12 comprises a dynamic logic AND gate according to an exemplary embodiment. The pull down network 12a of the logic gate 10a comprises a dynamic logic AND gate which is implemented as a series connection of two n-channel transistors $N_0$ and $N_1$, connected between the logic node 22 and the base transistor $N_F$. The first n-channel transistor $N_0$ is controlled by a first input signal a0 and the second n-channel transistor $N_1$ is controlled by a second input signal a1. Both input signals a0 and a1 are provided by the logic tree input 19.

Figure 4B:
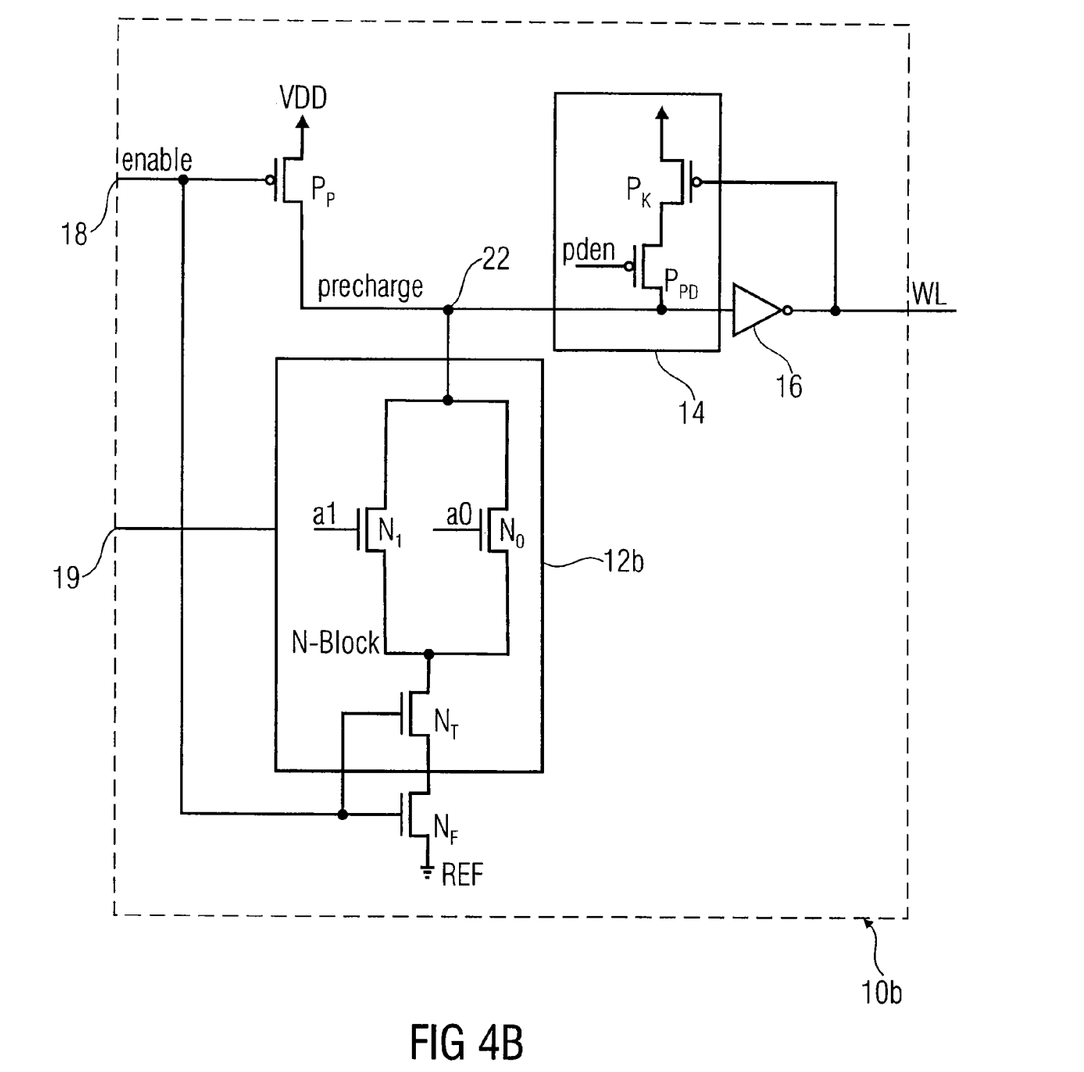
FIG. 4b shows a circuit diagram of the logic gate as depicted in FIG. 1a, the N-Block comprising a dynamic logic OR gate according to an exemplary embodiment.

FIG. 4b shows a circuit diagram of the logic gate 10 as depicted in FIG. 1a, wherein the N-block 12 comprises a dynamic logic OR gate according to an exemplary embodiment. The pull down network 12b of the logic gate 10b comprises a logic OR gate which is implemented as a series-connection of an n-channel compensation transistor $N_T$ and a parallel-connection of a first n-channel transistor $N_0$ and a second n-channel transistor $N_1$. The series-connection is connected between the logic node 22 and the base transistor $N_F$. The compensation transistor $N_T$ is controlled by the enabling signal "enable" and is adapted to compensate differences in the switching times of the first and the second n-channel transistors $N_0$, $N_1$. The first n-channel transistor $N_0$ is controlled by a first control signal $a_0$ and the second n-channel transistor $N_1$ is controlled by a second control signal a1. Both control signals a0, a1 are provided by the logic tree input 19.

The compensation transistor $N_T$ optimizes the performance of the pull down network 12b but is not necessarily required. Other embodiments may comprise a pull down network 12b without the compensation transistor $N_T$, such that the parallel connection of the first n-channel transistor $N_0$ and the second n-channel transistor $N_1$ is connected between the logic node 22 and the base transistor $N_F$. The logic gate 10 may also be implemented using transistors of complementary channel type. The base transistor $N_F$ may be implemented as p-channel transistor, the pull-down network 12 implemented as a pull-up network 12 comprising N p-channel (or optionally n-channel) transistors, the charging transistor $P_P$, the keeping transistor $P_K$ and the switching transistor $P_{PD}$ implemented as n-channel transistors. The sequence of the N-block 12 and the base transistor $N_F$ may be exchanged.

The invention claimed is:

1. A logic circuit comprising:
a plurality of logic gates each having an enabling input connected to an enabling signal input and a data output, each logic gate comprising:
   a first p-channel transistor being connected between a logic node and a supply potential and having a control terminal connected to the enabling signal input;
   a second n-channel transistor being connected between the logic node and a reference potential via an electrical path and having a control terminal connected to the enabling signal input;
   a data network serially connected into the electrical path and adapted to disable and enable the electrical path responsive to data at a data input;
   an inverter;
   a third p-channel transistor being connected between the supply potential and the logic node and having a control terminal connected to, via the inverter, the logic node; and
   a fourth p-channel transistor being serially connected along with the third p-channel transistor between the logic node and the supply potential and having a control terminal separately controllable relative to the control terminal of the third p-channel transistor; and
a plurality of WiredOr circuitries each comprising a WiredOr input and a WiredOr output, wherein the WiredOr input of each of the WiredOr circuitries is connected to the data output of an associated logic gate of the plurality of logic gates.

2. The logic circuit according to claim 1, further comprising a logic AND gate having a first inverting input, a second non-inverting input and an output connected to the control terminal of the fourth p-channel transistor.

3. The logic circuit according to claim 2, further comprising a dummy logic gate having an enabling input and an output and being adapted to provide a dummy output signal at the output responsive to a transition of a dummy enabling signal at the enabling input with a propagation delay not deviating by more than +/−10 percent from a propagation delay at which the data output provides an output signal upon a transition of an enabling signal at the enabling signal input.

4. The logic circuit according to claim 3, the output of the dummy logic gate being connected to the first inverting input of the logic AND gate and the enabling input of the dummy logic gate being connected to the second non-inverting input of the logic AND gate.

5. The logic circuit according to claim 1, wherein the WiredOr output is connected to the first inverting input of the logic AND gate, and
wherein the enabling signal input is connected to the second non-inverting input of the logic AND gate.

6. The logic circuit according to claim 1, being adapted to provide signals at the data output and at the data outputs of the plurality of logic gates according to a One-Hot signal coding.

7. The logic circuit according to claim 1, wherein only one of the data output and the plurality of data outputs changes a signal state upon a signal transition of the enabling signal input indicating a validity of the data outputs.

8. The logic circuit according to claim 1, forming an address decoder of a memory cell array.

* * * * *